United States Patent
Lee

(10) Patent No.: US 7,480,194 B2
(45) Date of Patent: Jan. 20, 2009

(54) DATA INPUT/OUTPUT (I/O) APPARATUS FOR USE IN A MEMORY DEVICE

(75) Inventor: Seung Hun Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/610,212

(22) Filed: Dec. 13, 2006

(65) Prior Publication Data

US 2007/0091693 A1    Apr. 26, 2007

Related U.S. Application Data

(63) Continuation of application No. 11/030,784, filed on Jan. 7, 2005, now Pat. No. 7,161,847.

(30) Foreign Application Priority Data

Apr. 13, 2004    (KR) .............................. 2004-25510

(51) Int. Cl.
*G11C 7/00*    (2006.01)
(52) U.S. Cl. .................... 365/196; 365/191; 365/207; 365/189.17
(58) Field of Classification Search ............... 365/191, 365/196, 207, 189.17
See application file for complete search history.

(56) References Cited

U.S. PATENT DOCUMENTS

| 5,305,280 | A | 4/1994 | Hayano |
| 5,768,210 | A | 6/1998 | Matsui et al. |
| 6,128,700 | A | 10/2000 | Hsu et al. |
| 6,151,273 | A | 11/2000 | Iwamoto et al. |
| 6,189,133 | B1 | 2/2001 | Burham et al. |
| 6,985,005 | B1 * | 1/2006 | Kim et al. .................... 326/26 |
| 7,161,847 | B2 | 1/2007 | Lee |

FOREIGN PATENT DOCUMENTS

| JP | 07-211069 | 8/1995 |
| KP | 10-2003-0026534 | 4/2003 |
| KP | 10-2003-0043410 | 6/2003 |

\* cited by examiner

*Primary Examiner*—Thong Q Le
(74) *Attorney, Agent, or Firm*—Marshall, Gerstein & Borun LLP

(57) ABSTRACT

A data I/O apparatus for use in a memory device. The data I/O apparatus for use in the memory device performs data transmission using the same polarity when neighbor global I/O lines have opposite polarities to reduce coupling noise generated between global I/O lines acting as data I/O lines of a memory device, performs data recovery, and basically deletes the coupling noise, such that it reduces the failure rate of the memory device.

2 Claims, 3 Drawing Sheets

DATA INPUT/OUTPUT (I/O) APPARATUS FOR USE IN A MEMORY DEVICE

CROSS-REFERENCE TO RELATED APPLICATIONS

This application is a continuation of U.S. Ser. No. 11/030,784 entitled "Data Input/Output (I/O) Apparatus for Use in Memory Device", filed on Jan. 7, 2005, the contents of which are herein incorporated by reference in their entirety.

BACKGROUND OF THE INVENTION

1. Field of the Invention

The present invention relates to a data Input/Output (I/O) apparatus for use in a memory device, and more particularly to a data I/O apparatus for use in a memory device, which performs data transmission using the same polarity when neighbor global I/O lines have opposite polarities to reduce coupling noise generated between global I/O lines acting as data I/O lines of a memory device, performs data recovery, and basically deletes the coupling noise, such that it reduces the failure rate of the memory device.

2. Description of the Related Art

With the increasing development of large-capacity DRAMs and high-speed DRAMs, improved DRAMs, each of which includes a sub wordline drive for operating a word line at a high speed and a hierarchical I/O line structure in which Local Input Output (LIO) and Global Input Output (GIO) lines of a data line are configured in the form of a hierarchical structure, have become widely used.

FIG. 1 is a structural diagram illustrating data I/O lines for use in a conventional DRAM including four banks.

Referring to FIG. 1, each of banks 0~3 include a row controller (X_CTRL) for enabling a word line (WL) and a column selector (Y_CTRL) for enabling a column selection signal (Yi) to determine a cell designated by the enabled word line (WL).

Data lines for reading/writing data of a cell determined by the word line (WL) and the column selection signal (Yi) are called I/O lines.

The above-mentioned I/O lines are differently called a Segment IO (SIO) line, a Local IO (LIO) line, and a Global IO (GIO) line, etc. according to their positions.

Elaborating upon functions of individual IO lines according to read paths, data of a cell bit line is amplified by the column selection signal (Yi) and the amplified data is loaded on a specific IO line. In this case, the specific IO line is indicative of an SIO line.

Thereafter, a data loaded on the SIO line is loaded on an LIO line which shares SIO lines of cell segment blocks classified for every Bit Line Sense Amplifier (BLSA) block of a single bank, such that it is applied to an Input Output Sense Amplifier (IOSA) for each bank.

Data sensed by the IOSA is loaded on the GIO line.

The above-mentioned GIO line acts as a bank-sharing line, and is indicative of a signal line drivable by each of four banks (Bank0~Bank3).

Data of the GIO line is outputted via desired data pads DQ0, DQ1, DQ2, ..., DQn-1 by an output driver, such that it can be read.

With the increasing development of high-speed DRAMs and low-power DRAMs, chip size and VDD voltage have become increasingly reduced. Therefore, levels of individual signals are lowered and an interval between lines is also reduced. The reduced VDD voltage and the reduced interval between the lines incur increased parasitic capacitance, and coupling noise between the lines is also increased due to the increased parasitic capacitance, such that the increased coupling noise generates a DRAM failure.

Particularly, a DRAM part greatly affected by the coupling noise is indicative of a GIO line acting as a data I/O line. The GIO line is indicative of the longest line of the DRAM. The higher the frequency, the shorter the line transition time. A specific phenomenon such as coupling noise frequently occurs in the GIO line.

There are a variety of methods for reducing the coupling noise in the above-mentioned GIO line, for example, a method of forming a GIO shield (VSS) line in an interval between GIO lines, and a method of employing a test mode line, etc.

The above-mentioned method for forming the VSS line in the interval between the GIO lines has a disadvantage in that it frequently incurs in the GIO line due to unexpected shaking of the VSS line and thus generally requires an additional repeater. However, the above-mentioned method for forming the VSS line in the interval between the GIO lines is the most popular method in recent times, and has another disadvantage in that it is unable to basically delete the coupling noise.

The above-mentioned method for employing the test mode line is affected by the GIO line, changes a current polarity to another polarity of a test mode, and affects DRAM operations, resulting in DRAM failure.

SUMMARY OF THE INVENTION

Therefore, the present invention has been made in view of the above problems, and it is an object of the present invention to provide a data I/O apparatus for use in a memory device, which performs data transmission using the same polarity when neighbor GIO lines have opposite polarities to reduce coupling noise generated between GIO lines acting as data I/O lines of a memory device, performs data recovery, and basically deletes the coupling noise, such that it reduces the failure rate of the memory device.

In accordance with the present invention, the above and other objects can be accomplished by a data Input/Output (I/O) apparatus for use in a memory device, comprising: a transceiver for receiving a plurality of GIO signals from an I/O sense amplifier contained in each bank of the memory device, comparing the received GIO signals with neighbor GIO signals, converting the GIO signals into other signals having the same polarities as in the neighbor GIO signals, and generating the converted signals along with a control signal required for conversion of the GIO signals; and a receiver for receiving a plurality of GIO signals and a control signal from the transceiver, recovering the received GIO signals having polarities changed by the control signal, and transmitting the recovered GIO signals to an output driver.

Preferably, the transceiver receives a plurality of GIO signals, bypasses a first GIO signal from among the received GIO signals, and generates the bypassed result, the transceiver including: a comparator for comparing a second GIO signal from among the received GIO signals with the first GIO signal, and generating a control signal; a first transmitter for bypassing the second GIO signal according to the control signal of the comparator, and generating the bypassed result; and a second transmitter for inverting the second GIO signal according to the control signal of the comparator, and generating the inverted result.

Preferably, the receiver bypasses a first GIO signal from among the GIO signals generated from the transceiver, and generates the bypassed result, the receiver including: a third transmitter for bypassing a second GIO signal from among the GIO signals generated from the transceiver according to the control signal of the transceiver, and generating the bypassed result; and a fourth transmitter for inverting the second GIO signal from among the GIO signals generated from the transceiver according to the control signal of the transceiver, and generating the inverted result.

Therefore, in the case of GIO lines for transmitting an output signal of the I/O sense amplifier to the output driver capable of outputting the received output signal to a data pad, the above-mentioned data I/O apparatus according to the present invention installs the transceiver for comparing polarities of signals loaded on neighbor GIO lines from among the GIO lines and the receiver for recovering a signal received from the transceiver in the GIO lines, such that it allows data loaded on the neighbor GIO lines to have the same polarity and transmits the data. As a result, the data I/O apparatus basically removes the coupling noise generated by the neighbor GIO lines during transmission of the data, such that it prevents memory failure.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
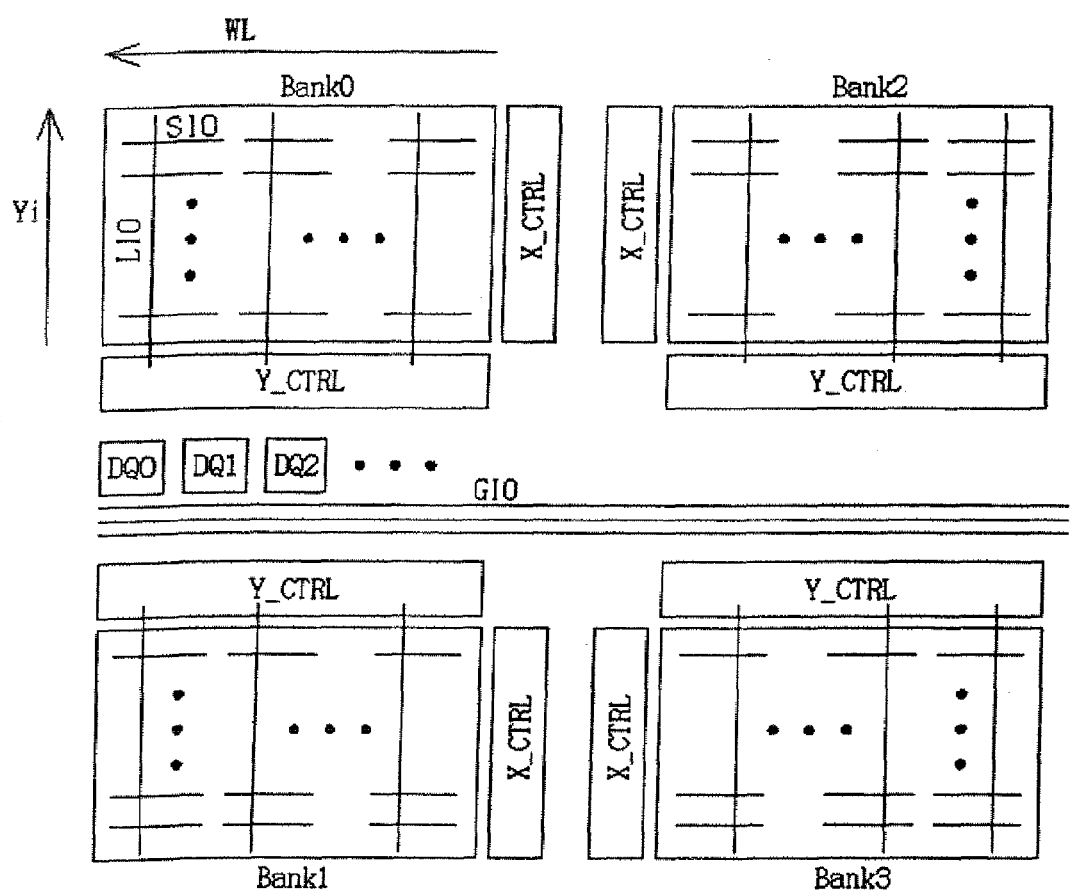
FIG. 1 is a structural diagram illustrating a data I/O apparatus for use in a conventional DRAM including four banks.
Figure 2:
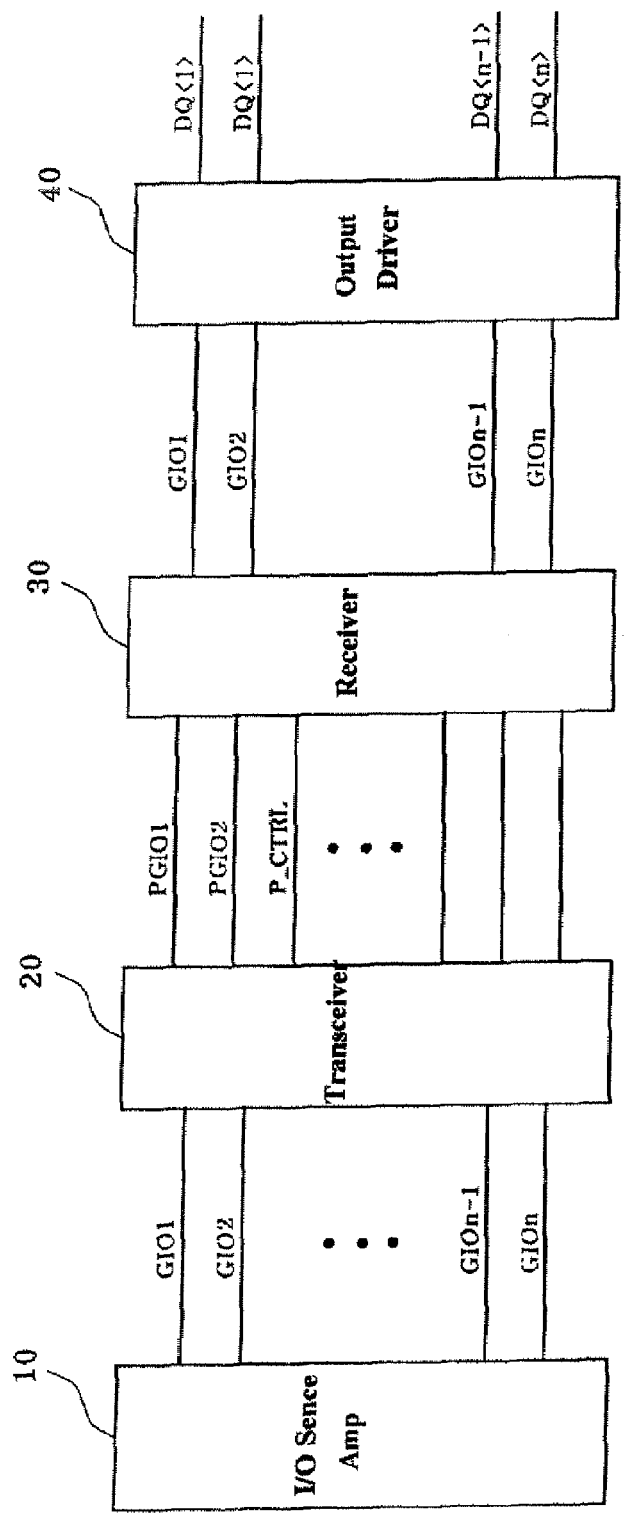
FIG. 2 is a block diagram illustrating a data I/O apparatus for use in a memory device according to the present invention.

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear. FIG. 2 is a block diagram illustrating a data I/O apparatus for use in a memory device according to the present invention.

Referring to FIG. 2 the data I/O apparatus includes an I/O sense amplifier 10 contained in each bank (not shown) of the memory device, a transceiver 20 for receiving a plurality of GIO signals (GIO1~GIOn) from the I/O sense amplifier 10, comparing the received GIO signals with neighbor GIO signals, converting the GIO signals into other signals having the same polarities as the neighbor GIO signals, and generating the above other signals along with a control signal (P_CTRL) required for the conversion of the GIO signals; and a receiver 30 for receiving a plurality of GIO signals and a plurality of control signals (P_CTRL) from the transceiver 20, recovering the GIO signals having polarities changed by the control signals (P_CTRL), and transmitting the recovered GIO signals to an output driver 40.

Figure 3:
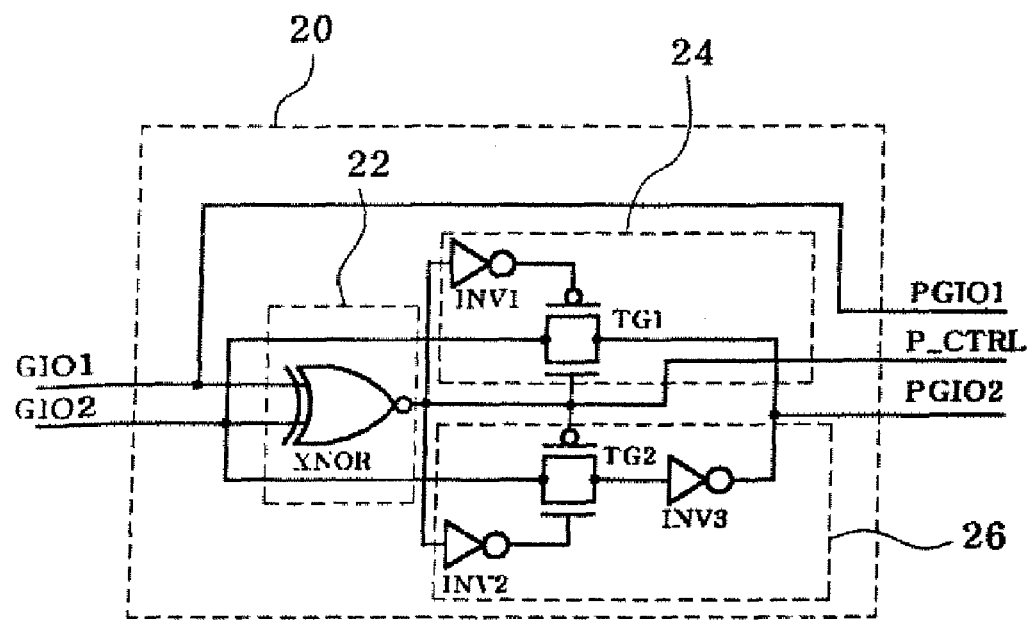
FIG. 3 is a circuit diagram illustrating a transceiver for use in the data I/O apparatus for use in the memory device according to the present invention.

FIG. 3 is a circuit diagram illustrating the transceiver for use in the data I/O apparatus for use in the memory device according to the present invention.

Although only first and second GIO signals GIO1 and GIO2 from among a plurality of GIO signals (GIO1~GIOn) of the transceiver 20 are described in FIG. 3, it should be noted that the remaining GIO signals other than the first and second GIO signals GIO1 and GIO2 are configured in the same manner as in the first and second GIO signals GIO1 and GIO2. Therefore, the transceiver 20 receives the first GIO signal GIO1 and the second GIO signal GIO2, and bypasses the first GIO signal GIO1, such that it generates the bypassed result as a first PGIO signal (PGIO1). The transceiver 20 includes a comparator 22, a first transmitter 24 and a second transmitter 26. The comparator 22 compares the second GIO signal GIO2 with the first GIO signal GIO1, and generates a control signal (PCTRL). The first transmitter 24 bypasses the second GIO signals GIO2 according to the control signal (P_CTRL) of the comparator 22, and generates a second PGIO signal PGIO2. The second transmitter 26 inverts the second GIO signal GIO2 according to the control signal (P_CTRL) of the comparator 22, and generates a second PGIO signal PGIO2.

Figure 4:
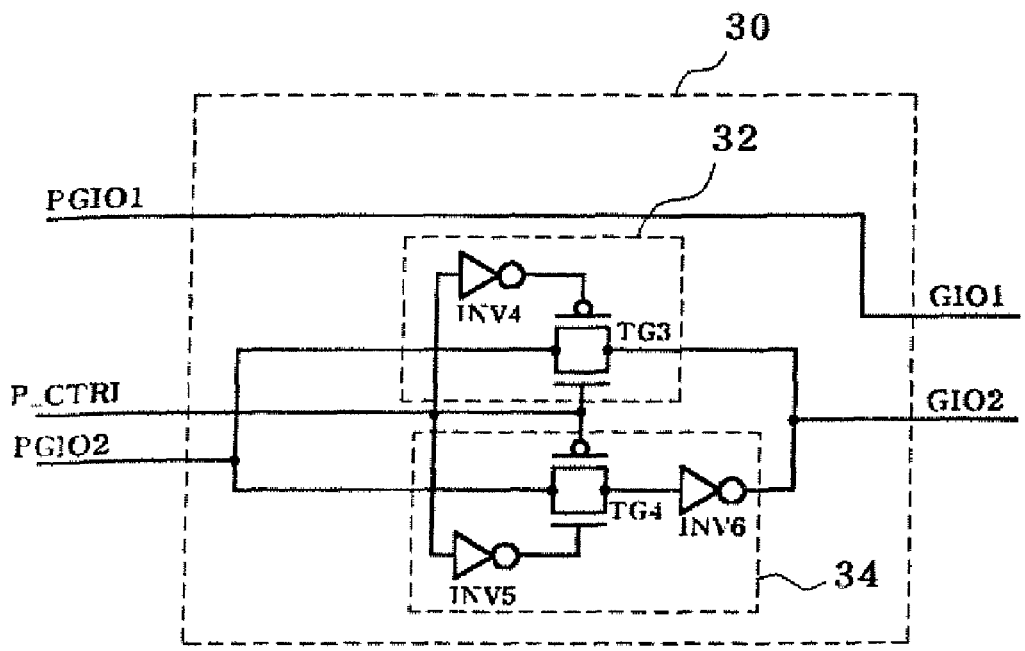
FIG. 4 is a circuit diagram illustrating a receiver for use in the data I/O apparatus for use in the memory device according to the present invention.

In this case, the second GIO signal GIO2 may be bypassed such that the bypassed result may be generated. The first GIO signal GIO1 may be selectively bypassed by the first transmitter 24 and the second transmitter 26, or may also be inverted by the same. FIG. 4 is a circuit diagram illustrating the receiver for use in the data I/O apparatus for use in the memory device according to the present invention.

Similar to the above-mentioned transceiver 20, although only first and second GIO signals GIO1 and GIO2 from among a plurality of GIO signals (GIO1~GIOn) of the receiver 30 are described in FIG. 4, it should be noted that the remaining GIO signals other than the first and second GIO signals GIO1 and GIO2 are configured in the same manner as in the first and second GIO signals GIO1 and GIO2.

In more detail, the receiver 30 bypasses the first PGIO signal PGIO1 generated from the transceiver 20, and generates a first GIO signal GIO1. The receiver 30 includes a third transmitter 32 and a fourth transmitter 34. The third transmitter 32 bypasses the second PGIO signal (PGIO2) generated from the transceiver 20 according to a control signal (P_CTRL) of the transceiver 20, and generates a second GIO signal (GIO2). the fourth transmitter 34 inverts the second PGIO signal (PGIO2) generated from the transceiver 20 according to the control signal (P_CTRL) of the transceiver 20, and generates a second GIO signal (GIO2).

Detailed operations of the above-mentioned data I/O apparatus for use in the memory device according to the present invention will hereinafter be described.

The first and second GIO signals GIO1 and GIO2 generated from the I/O sense amplifier 10 are applied to an XNOR gate acting as the comparator 22 of the transceiver 20, such that the XNOR gate determines whether the first GIO signal GIO1 has the same polarity as the second GIO signal GIO2. If it is determined that the first GIO signal GIO1 has the same polarity as the second GIO signal GIO2, the XNOR gate generates a high-level control signal (P_CTRL). Otherwise, if it is determined that the first and second GIO signals GIO1 and GIO2 have different polarities, the XNOR gate generates a low-level control signal (P_CTRL).

In this case, the first GIO signal GIO1 is bypassed, such that it is generated as a first PGIO signal PGIO1. If the second GIO signal GIO2 is equal to the first GIO signal GIO1 according to the control signal (P_CTRL), the control signal (P_CTRL) remains high in level, a first transmission transistor (TG1) of the first transmitter 24 is switched on, and an input polarity is bypassed without any change, such that a second PGIO signal (PGIO2) is generated. Otherwise, if the second GIO signal GIO2 is different from the first GIO signal GIO1, the control signal (P_CTRL) remains low in level, and an input signal entered by switching on the second transmission transistor (TG2) of the second transmitter 26 is inverted by a third inverter (INV3), such that a second PGIO signal (PGIO2) is generated.

In this manner, the GIO signals generated from the transceiver 20 are converted into other signals to allow neighbor GIO lines to have the same polarity, and the converted result is transmitted to the receiver 30.

The receiver 30 bypasses the first PGIO signal (PGIO1), such that the bypassed result is transmitted to the output driver 40 as a first GIO signal (GIO1). If the control signal (P_CTRL) remains high in level according to the control signal (P_CTRL) transmitted from the transceiver 20, the second PGIO signal (PGIO2) received when a third transmission transistor TG3 of the third transmitter 32 is switched on is bypassed, such that the bypassed result is transmitted to the output driver 40 as a second GIO signal (GIO2). However, if the control signal (P_CTRL) transmitted from the transceiver 20 remains low in level, the second PGIO signal (PGIO2) received when a fourth transmission transistor TG4 of the fourth transmitter 34 is switched on is inverted by a sixth inverter (INV6), such that the bypassed result is transmitted to the output driver 40 as a second GIO signal (GIO2).

In this manner, the GIO signal generated from the I/O sense amplifier 10 is compared with a signal of a neighbor GIO line. In this case, if the polarity of the GIO signal generated from the I/O sense amplifier 10 is opposite to that of the neighbor GIO line signal, data is transmitted using the same polarity to perform data recovery, and the coupling noise is basically removed and transmitted in such a way that the coupling noise can be removed by the data I/O apparatus.

As apparent from the above description, the data I/O apparatus according to the present invention performs data transmission using the same polarity when neighbor GIO lines have opposite polarities to reduce coupling noise generated between GIO lines acting as data I/O lines of a memory device, performs data recovery, and basically deletes the coupling noise, such that it reduces the failure rate of the memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A data Input/Output (I/O) apparatus for use in a memory device, comprising:
    an I/O sense amplifier for outputting a first Global Input Output (GIO) signal and a neighboring GIO signal;
    a transceiver configured to receive the first GIO signal and the neighboring GIO signal; and
    a receiver configured to receive the output signal of the transceiver, and
    an output driver configured to receive the output of the receiver for driving,
    wherein the transceiver is configured to convert the polarity of the GIO signal when the polarity of the GIO signal is different from that of a neighboring GIO signal, and the receiver configured to convert the polarity of the GIO signal if polarity of the GIO signal was converted by the transceiver.

2. A data Input/Output (I/O) Method for use in a memory device, comprising:
    converting a polarity of a GIO signal when the polarity of the GIO signal is different from that of a neighboring GIO signal; and
    converting the polarity of the GIO signal if the polarity of the GIO signal was converted; and
    receiving the GIO signal and the neighboring GIO signal, and transmitting the GIO signal and the neighboring GIO signal to drive.

* * * * *